US010992107B2

(12) United States Patent
Zhang

(10) Patent No.: US 10,992,107 B2
(45) Date of Patent: Apr. 27, 2021

(54) NARROW-LINEWIDTH LASER

(71) Applicant: Suzhou Institute of Nano-Tech and Nano-Bionics (Sinano), Chinese Academy of Sciences, Suzhou (CN)

(72) Inventor: Ruiying Zhang, Suzhou (CN)

(73) Assignee: Suzhou Institute of Nano-Tech and Nano-Bionics, Chinese Academy of Sciences, Suzhou (CN)

( * ) Notice: Subject to any disclaimer, the term of this patent is extended or adjusted under 35 U.S.C. 154(b) by 0 days.

(21) Appl. No.: 16/349,127

(22) PCT Filed: Nov. 14, 2017

(86) PCT No.: PCT/CN2017/110792
§ 371 (c)(1),
(2) Date: May 10, 2019

(87) PCT Pub. No.: WO2018/086618
PCT Pub. Date: May 17, 2018

(65) Prior Publication Data
US 2019/0273358 A1    Sep. 5, 2019

(30) Foreign Application Priority Data

Nov. 14, 2016   (CN) .......................... 201610999549.5

(51) Int. Cl.
*H01S 5/14* (2006.01)
*H01S 5/10* (2021.01)
(Continued)

(52) U.S. Cl.
CPC ............ *H01S 5/1003* (2013.01); *H01S 3/083* (2013.01); *H01S 5/028* (2013.01); *H01S 5/10* (2013.01);
(Continued)

(58) Field of Classification Search
CPC .............................. H01S 5/142; H01S 5/1032
See application file for complete search history.

(56) References Cited

U.S. PATENT DOCUMENTS 7,376,167 B2 *  5/2008  Yu ...................... G02B 6/12004
                                                         372/20
9,810,931 B2 * 11/2017  Zhang .................... H01S 5/026
(Continued)

FOREIGN PATENT DOCUMENTS

CN          1675807 A     9/2005
CN        103490279 A     1/2014
(Continued)

*Primary Examiner* — Michael Carter
(74) *Attorney, Agent, or Firm* — Wang Law Firm, Inc.

(57) ABSTRACT

The present disclosure discloses a narrow-linewidth laser. The narrow-linewidth laser comprises a passive ring waveguide, a first passive input/output waveguide which is coupled with the passive ring waveguide, a gain wavelength-selection unit which is used for providing gain for the whole laser and is configured to be capable of selecting the light with a specific wavelength to be coupled into the passive ring waveguide, and a second passive input/output waveguide which is coupled with the passive ring waveguide in order to output lasing light from the laser. The narrow-linewidth semiconductor laser provided by the present disclosure has a simple structure and does not have butt-joint coupling loss between a gain region and a waveguide external cavity region. There is no a linewidth limitation caused by butt-coupling loss in such semiconductor lasers. Moreover, because of the integral formation semiconductor technique, the laser should have low cost, higher stability and reliability, and higher resistance to severe environment. Furthermore, based on a loss compensation structure, a ring external cavity of the laser can work in a critical coupling state under different coupling coefficients.

(Continued)

Therefore, the laser with a narrow linewidth and a high side-mode suppression ratio should be achieved.

20 Claims, 5 Drawing Sheets

(51) Int. Cl.
    *H01S 5/028*     (2006.01)
    *H01S 5/20*     (2006.01)
    *H01S 3/083*     (2006.01)

(52) U.S. Cl.
    CPC .............. *H01S 5/1096* (2013.01); *H01S 5/14* (2013.01); *H01S 5/20* (2013.01)

(56) References Cited

U.S. PATENT DOCUMENTS

| | | | |
|---|---|---|---|
| 2002/0105998 A1 | 8/2002 | Ksendzov | |
| 2004/0037341 A1* | 2/2004 | Tan | G02B 6/12007 |
| | | | 372/94 |
| 2016/0294158 A1* | 10/2016 | Chen | H01S 5/1007 |

FOREIGN PATENT DOCUMENTS

| | | | | |
|---|---|---|---|---|
| CN | 104242052 A | 12/2014 | | |
| CN | 105680320 A | 6/2016 | | |
| WO | WO2014201964 | * | 12/2014 | |
| WO | WO-2014201964 A1 | * | 12/2014 | ........... H01S 5/1071 |

\* cited by examiner

NARROW-LINEWIDTH LASER

TECHNICAL FIELD

The present disclosure relates to a laser, and specifically relates to a narrow-linewidth laser.

BACKGROUND

Narrow-linewidth laser is a high-quality light source in the field of information communication (sensing) due to its excellent coherence, so it is of high value. The narrow-linewidth laser can not only be applied to frontier science researches such as high-precision spectral measurement, quantum (atom) frequency standards and the like, but also the field of national defense security such as laser ranging, laser radar, optoelectronic countermeasure, laser communication and the like; furthermore, the narrow-linewidth laser is the core element of the coherent light communication, distributed optical fiber sensing and is widely applied to the field of internet of things and high-speed communication.

Due to the wide and attractive application prospect of the narrow-linewidth laser, numerous researchers and investment organizations study the narrow-linewidth laser. The following structures are gradually achieved:

(1) a structure of semiconductor gain region and bulk-type wavelength selection and linewidth shortening (the application numbers of the patents are: CN86202829U, 200320130968.3, 200810082028.9, 200910235585.4, 201210258846.6, 201310395264.7, 201310535501.5, 201310728387.8, 201410482266.4, U.S. Pat. No. 408,739, 201410602303.0, and U.S. Pat. No. 549,347);

(2) a structure of a semiconductor gain region and an optical fiber (the application numbers of the patents are: 200510079902, 200910050715.7, 201410386617.1, 201220642467.2 and U.S. Pat. No. 368,654);

(3) a structure of a semiconductor laser-pumped all-fiber laser (the application numbers of the patents are: 201120374776.1, 201210535987.8, 201410271316.4, 201320784023.7 and 201420684717.8), and a structure of a DFB/DBR semiconductor laser (the application numbers of the patents are: 201310019361.6, 201310211088.7, 86113437.7, 88306703.5, U.S. Ser. No. 10/064,002 and U.S. Ser. No. 12/751,900); and (4) a structure of a waveguide external-cavity semiconductor laser (the application numbers of the patents are: 12006832.5, U.S. Pat. No. 276,763, U.S. Ser. Nos. 09/741,790 and 13/249,753).

Compared with the above other hybrid narrow-linewidth lasers, a pure semiconductor laser is loved by various application fields due to its advantages of compact structure, small size, small weight, low energy consumption, high reliability, long service life and the like. However, the traditional DFB or DBR laser has limited cavity length, and although the wavelength is selected by utilizing a complex grating structure, the ultra-narrow linewidth is hard to be obtained, which directly limits their application in the above fields.

In 2001, the narrow linewidth is achieved by a weak-coupling ring external-cavity semiconductor laser in the United States, however, the cavity loss is too large, a single ring external-cavity laser has never been realized (Appl. Phys. Lett., 79(22)3561, (2001). IEEE J. Quantum. Electron., 39(7), 859, (2003)). Hereafter, a plurality of organizations achieve a narrow-linewidth semiconductor laser by transforming this thought (OSA/OFC/NFOEC2010/0ThQ5, Proc. of SPIE Vol. 7943, 79431G, (2011), Appl. Phys. Express, 5, 082701, (2012), J. Lightwave Tech. 3(6)1241, (2015), Jap. J. Appl. Phys. 53, 04EG04, (2014), IEEE J. Sel. Top. Quantum Electron, 21(6), 1501909, (2015), Optics Lett., 40(7)1504, (2015)).

The above lasers fully utilize the ring resonator cavity to extend the optical cavity length so as to cause a great improvement of the linewidth of the laser compared with the DFB and DBR lasers, but in all structures here, a Si-based photon integrated circuit is as a linewidth shortening unit, III-V SOA is as the gain region, and the both are combined and integrated to form the narrow-linewidth semiconductor laser. It is inevitable for such hybrid integration laser to induce the following disadvantages: (1) the yield of the laser is low due to the complex Si-based photon integrated circuit and butt-joint coupling scheme; and (2) the linewidth, the reliability, the stability and the resistance to server environment are limited due to their butt-joint coupling of different materials, which unavoidably induce the coupling loss and polarization loss.

SUMMARY

An objective of the present disclosure is to provide a narrow-linewidth laser in order to overcome the deficiency of the prior art.

In order to achieve the above objective, the present disclosure provides the following technical scheme.

Embodiments of the present disclosure disclose a narrow-linewidth laser. The narrow-linewidth laser is monolithically integrated and comprises:

a passive ring waveguide;

a first passive input/output waveguide, coupled with the passive ring waveguide;

a gain wavelength-selection unit, used for providing gain for the whole laser and configured to be capable of selecting the light with a specific wavelength to be coupled into the passive ring waveguide; and a second passive input/output waveguide, coupled with the passive ring waveguide in order to output lasing light from the laser.

In one embodiment, the gain wavelength-selection unit comprises a gain waveguide used for providing gain for the laser, wherein the gain waveguide is coupled with the first input/output waveguide in order to carry out wavelength selection.

In one embodiment, the gain wavelength-selection unit comprises a gain waveguide for providing the gain for the laser, a part of the first input/output waveguide and a first grating matching with the first input/output waveguide to carry out the wavelength selection.

In one embodiment, the gain waveguide is vertically coupled or laterally coupled with the first input/output waveguide, and the gain waveguide covers a part of the top surface of the first input/output waveguide vertically or is located adjacent to the first input/output waveguide laterally. Preferably, the gain waveguide is arranged at one end of the first input/output waveguide; and a first absorber is integrated at the other end of the first input/output waveguide in order to eliminate stray lights and back reflection noises.

In one embodiment, the laser comprises a first active waveguide integrated and coupled with the passive ring waveguide, and the first active waveguide is used for compensating the cavity loss of the passive ring waveguide resonator. Preferably, the first active waveguide is vertically coupled or laterally coupled with the passive ring waveguide; and the first active waveguide covers at least a part of the top surface of the passive ring waveguide vertically or is located adjacent to the passive ring waveguide laterally.

In one embodiment, the laser further comprises a second active waveguide, the second active waveguide coupled with the second input/output waveguide acts as an optical amplifier to amplify the lasing light outputted by the second input/output waveguide, and based on this, the output power is enhanced and the linewidth of the laser is further shortened.

In one embodiment, the second active waveguide is vertically coupled or laterally coupled with the second input/output waveguide, and the second active waveguide covers a part of the top surface of the second input/output waveguide vertically or is located adjacent to the second input/output waveguide laterally. Preferably, the second active waveguide is arranged at one end of the second input/output waveguide; and a second absorber is integrated at the other end of the second input/output waveguide in order to eliminate stray lights and back reflection noises.

In one embodiment, antireflection films are deposited on the facets of the second active waveguide and/or the second input/output waveguide and are used for reducing residual reflection light; and/or the gain waveguide, the first active waveguide and the second active waveguide are monolithically integrated or on-chip integrated with the corresponding first input/output waveguide, the passive ring waveguide and the second input/output waveguide through a material growth or wafer bonding manner.

In one embodiment, the gain waveguide, the first input/output waveguide, the passive ring waveguide, the first active waveguide, the second input/output waveguide and the second active waveguide are arranged on the substrate, and the materials of the gain waveguide, the first input/output waveguide, the passive ring waveguide, the first active waveguide, the second input/output waveguide and the second active waveguide are selected according to the material of the substrate, which may be semiconductors or dielectric materials. Preferably, the material of the substrate is selected from a group consisting of Si, GaAs, InP, SOI or GaN.

In one embodiment, high-reflectance films are deposited on the facets of the gain waveguide and/or the first input/output waveguide and are used for reducing the Mirror loss; and/or the passive ring waveguide, the first input/output waveguide and the second input/output waveguide are fabricated from the same material and are formed on the substrate; and/or the second input/output waveguide is further provided with a second grating corresponding to the second active waveguide.

Compared with the prior art, the narrow-linewidth semiconductor laser provided by the present disclosure has a simple structure and does not have butt-coupling loss between a gain region and an external cavity, therefore, the limitation of the narrow linewidth induced by the butt-coupling loss is completely avoidable for such integrated semiconductor lasers. Moreover, the laser has low cost, higher stability and reliability, narrower linewidth and higher resistance to severe environment; furthermore, the laser provided by the present disclosure is of capability to ensure that the ring external cavity works in a critical coupling state due to their loss-compensated ring external cavity, by which, the laser with a narrower linewidth and a higher side-mode suppression ratio can be achieved.

BRIEF DESCRIPTION OF THE DRAWINGS

To describe the technical schemes in the embodiments of the present disclosure or the prior art more clearly, the following briefly introduces the accompanying drawings required for describing the embodiments or the prior art. Apparently, the accompanying drawings in the following description show merely some embodiments in the present disclosure, and a person of ordinary skill in the art may still derive other drawings from these accompanying drawings without creative efforts.

DESCRIPTION OF THE EMBODIMENTS

The following describes the technical schemes in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 1:
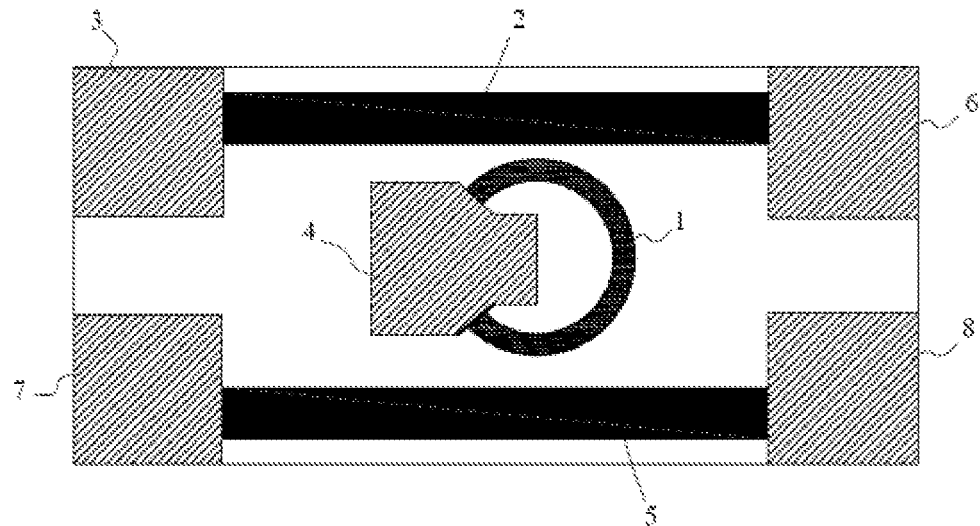
FIG. 1 is a top view of a structure of a narrow-linewidth semiconductor laser in embodiments of the present disclosure.
Figure 2:
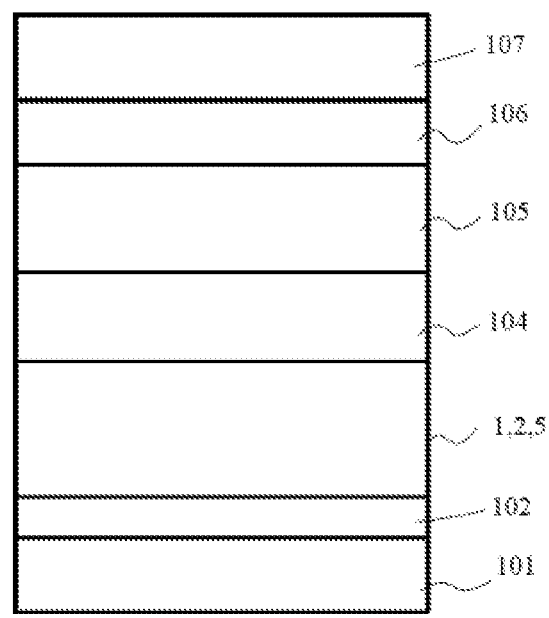
FIG. 2 is a schematic diagram of a material structure of the narrow-linewidth semiconductor laser in embodiments of the present disclosure.
Figure 3:
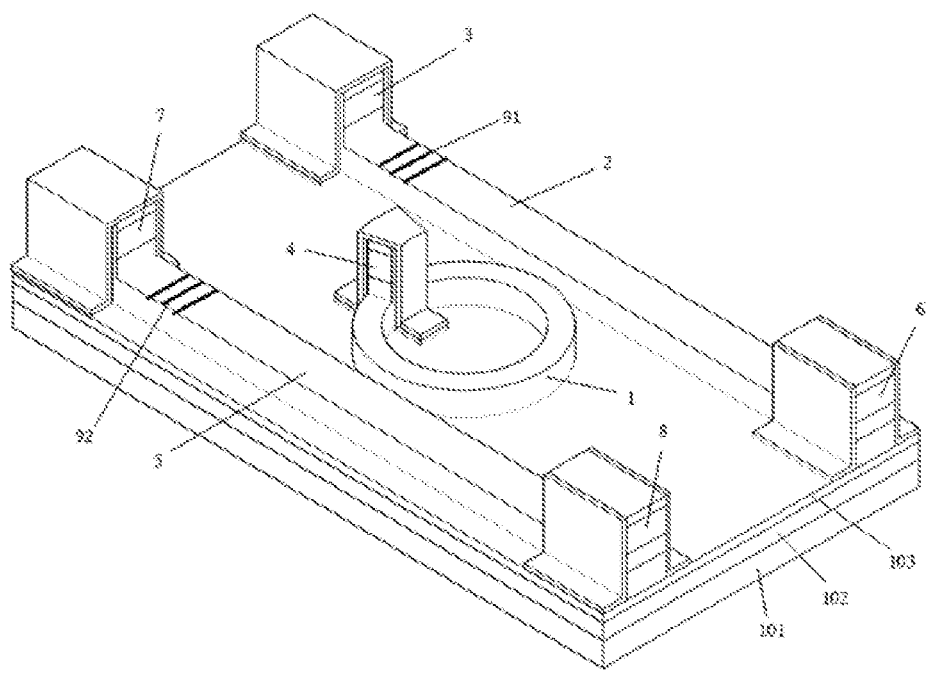
FIG. 3 is a schematic diagram of a stereo structure of the narrow-linewidth semiconductor laser in embodiments of the present disclosure.

As shown in FIG. 1 to FIG. 3, embodiments of the present disclosure disclose a narrow-linewidth laser. The laser may be of, for example, monolithic integration and comprises a passive ring waveguide 1, a first passive input/output waveguide 2, a gain wavelength-selection unit and a second passive input/output waveguide 5.

Wherein the first input/output waveguide 2 may be, for example, laterally coupled with the passive ring waveguide 1; the gain wavelength-selection unit is used for providing gain for the whole laser and is configured to be capable of selecting the light with a specific wavelength to be coupled into the first input/output waveguide 2 and to obtain the gain, and then the light is coupled into the passive ring waveguide 1; and the second input/output waveguide 5 may be, for example, laterally coupled with the passive ring waveguide 1 in order to output lasing light from the laser. In the embodiment, the passive ring waveguide 1 is respectively weakly coupled with the first input/output waveguide 2 and the second input/output waveguide 5 in order to improve its quality factor, extend the optical length, and further shorten the linewidth of the lasing light.

In one embodiment, the gain wavelength-selection unit comprises a gain waveguide 3 used for providing gain for the laser, specifically, the gain waveguide 3 is coupled with the first input/output waveguide 2, so that the gain spectrum provided by the gain waveguide 3 or the laser can be filtered through the coupling between the gain waveguide 3 and the first input/output waveguide 2, and only the selected wavelength light with gain can be propagated in the first input/output waveguide 2 finally.

In one embodiment, the gain wavelength-selection unit may further comprise a first grating 91 matching with the first input/output waveguide to further carry out wavelength selection in order to further optimize the wavelength selection function.

In the embodiment, the functional configuration of a single-mode laser may be achieved by coupling between the gain waveguide 3 and the first input/output waveguide 2 and arrangement of the first grating 91.

In one embodiment, the laser further comprises a first active waveguide 4 integrated and coupled with the passive ring waveguide 1, and the first active waveguide 4 is used for compensating the cavity loss of the passive ring waveguide resonator in order to improve its quality factor.

The first active waveguide 4 may be internally inserted in the passive ring waveguide 1 and is vertically coupled with the passive ring waveguide 1 in order to compensate the loss of the ring resonator cavity, wherein the first active waveguide 4 covers at least a part of the top surface of the passive ring waveguide 1 vertically and compensates the propagation loss when the light propagates in the passive ring waveguide 1, by which, high quality factor should be achieved in the passive ring resonator cavity, and the linewidth of the laser is effectively shortened. It is ensured that the light coupled from the second input/output waveguide 5 has a better narrow linewidth effect.

The number of the passive ring waveguide 1 may be one and may also be two or more than two, and one or a plurality of first active waveguides may be arranged on each passive ring waveguide 1, for example, one or a plurality of first active waveguides may be vertically coupled with each passive ring waveguide 1.

In the laser, the light is coupled from the first input/output waveguide 2 to the passive ring waveguide 1, and is coupled from the second input/output waveguide 5 to the outside.

Preferably, the first input/output waveguide 2 and the second input/output waveguide 5 are respectively located on the two sides of the passive ring waveguide 1. More preferably, the first input/output waveguide 2 and the second input/output waveguide 5 are arranged in parallel. In some embodiments, the first input/output waveguide 2 and the second input/output waveguide 5 may have the same length.

In the technical scheme, when the light with a specific wavelength range, propagating in the first input/output waveguide 2, reaches a coupled position of the first input/output waveguide 2 and the passive ring waveguide 1, the light is weakly coupled, then a part of the light is coupled into the passive ring waveguide 1, so its optical path is effectively extended based on the high quality factor of the passive ring waveguide 1, the spectrum width of the lasing light is largely shortened, and narrow linewidth output is obtained after the light is outputted from the second input/output waveguide 5.

The gain waveguide 3 may be vertically coupled or laterally coupled with the first input/output waveguide 2. In one embodiment, the gain waveguide 3 covers a part of the top surface of the first input/output waveguide 2 vertically in order to be vertically coupled with the first input/output waveguide 2. Preferably, the gain waveguide 3 is formed at one end of the first input/output waveguide 2.

A first absorber 6 is integrated at the other end of the first input/output waveguide 2 and is used for eliminating stray lights and back reflection noises. The first absorber 6 is integrated at an output back end of the first input/output waveguide 2 and is used for absorbing the back reflection noises.

In one embodiment, the laser further comprises a second active waveguide 7, the second active waveguide 7 coupled with the second input/output waveguide 5 acts as an optical amplifier to amplify the lasing light outputted by the second input/output waveguide 5, and based on this, the output power is enhanced and the linewidth of the laser is shortened. Specifically, the second active waveguide 7 may be vertically coupled or laterally coupled with the second input/output waveguide 5. In one embodiment, the second active waveguide 7 covers a part of the top surface of the second input/output waveguide 5 vertically in order to be vertically coupled with the second input/output waveguide 5. Preferably, the second active waveguide 7 is formed at one end of the second input/output waveguide 5.

A second absorber 8 is integrated at the other end of the second input/output waveguide 5 in order to eliminate stray lights and back reflection noises. The second absorber 8 is integrated at an output back end of the second input/output waveguide 5 and is used for absorbing the back reflection noises.

It should be noted that, in the embodiment, the second active waveguide 7 and the gain waveguide 3 both are located on the same side of the passive ring waveguide 1, and correspondingly, the first absorber 6 and the second absorber 8 both are located on the other side of the passive ring waveguide 1.

In one embodiment, high-reflective films are deposited on the facets of the gain waveguide 3 and/or the first input/output waveguide 2 and are used for reducing the Mirror loss, and antireflection films are deposited on the facets of the second active waveguide 7 and/or the second input/output waveguide Sand are used for reducing residual reflection light, thereby reducing the influence on dynamic property such as linewidth of the laser.

In one embodiment, a second grating 92 is defined in the part of the second input/output waveguide 5 according to the requirement of the second active waveguide 7 in order that the second active waveguide 7 amplifies the outputted lasing light, thereby enhancing the output power and further shortening the linewidth.

In one embodiment, the gain waveguide 3, the first active waveguide 4 or the second active waveguide 7 comprises a space layer 104, an active gain layer 105, a cladding layer 106 and a contact layer 107 that are sequentially laminated.

Preferably, the material of the space layer 104 is InP, the material of the active gain layer 105 is the InGa(Al)As(P)/InGa(Al)As(P) quantum well or bulk material, the material of the cladding layer 106 is InP, and the material of the contact layer 107 is InGaAs.

Furthermore, the passive ring waveguide 1, the first input/output waveguide 2 and the second input/output waveguide 5 are fabricated from the same material and are integrated on the substrate 101, and a buffer layer 102 and a passive waveguide layer 103 may be sequentially formed on the surface of the substrate 101.

The material of the substrate 101 may be selected from a group consisting of Si, SOI, GaAs, InP or GaN, and the materials of the gain waveguide 3, the first input/output waveguide 2, the passive ring waveguide 1, the first active waveguide 4, the second input/output waveguide 5 and the second active waveguide 7 are selected according to the material of the formed substrate 101, which may be semiconductors or dielectric materials, for example, when the material of the substrate is Si (an SOI substrate), the material of each waveguide layer thereon may be SiN or Si; when the material the substrate is GaN, the material of each waveguide layer thereon may be InGaN; and when the material of the substrate is InP, the material of each waveguide layer thereon may be InGaAsP or InGaAlAs. The above described materials of the substrate are merely exemplary, but not limited to the corresponding materials of each waveguide layer.

Preferably, the materials of the passive ring waveguide 1, the first input/output waveguide 2 and the second input/output waveguide 5 are InGaAs(P).

In the present disclosure, the coupling between the gain waveguide and the first input/output waveguide and between the second active waveguide and the second input/output waveguide may be planar coupling, vertical coupling or butt coupling as long as the above regions can provide the gain (or absorb) for inputted/outputted light and meet requirements of the laser. The laser may be of an on-chip integration structure or a monolithic integration structure, and a proper material for each part of the laser is selected corresponding to the different integration structures.

By taking the vertical coupling for example, the fabrication process of the structure of the above narrow-linewidth semiconductor laser is as follows:

(1) sequentially growing a buffer layer, active vertical coupling structures, a surface cladding layer and a contact layer on a substrate;

specifically, in the step of sequentially growing a buffer layer, active vertical coupling structures, a surface cladding layer and a contact layer on a substrate, the substrate and a growth-related buffer layer should be selected according to a material epitaxy technology and a selected material system of the active vertical coupling structures, the substrate may be a Si substrate, a GaAs substrate and an InP, even GaN, substrate, and the buffer layer should firstly ensure that its above structure obtains high wafer quality; and the active vertical coupling structures comprise an active layer for providing the gain, a middle space layer and a passive waveguide layer for providing signal propagation, their specific material composition, thicknesses and doping situations should be determined according to the selected material system, for example, the active layer is an InGaAsP layer with the wavelength of 1.55 microns, the space layer is an InP layer, the passive waveguide layer is an InGaAsP layer with the wavelength of 1.2 microns, and their thicknesses should firstly ensure that the coupling of evanescent waves is satisfied.

(2) defining the pattern of a ring cavity, input/output coupled waveguides, a gain region, an output amplification region and absorption regions by lithography on the epitaxied wafer;

specifically, in the step of defining the pattern of a ring cavity, input/output coupled waveguides, a gain region, an output amplification region and absorption regions by lithography on the epitaxied wafer, the lithography manner comprises general ultraviolet lithography, and also comprises electron beam lithography and projection type lithography, or comprises a combination of the above lithography manners, in a word, it is firstly ensured that the patterns of the ring cavity and the input/output waveguides meeting the requirements are formed. The patterns of the ring cavity may be circular, runway-shaped and rectangular, or other any closed waveguide patterns; and the input/output waveguides may be straight waveguides, curve waveguides and the like. One or a plurality of the ring cavities may be arranged as long as the requirements of devices are met.

(3) transferring the defined patterns onto an III-V semiconductor to obtain the ring cavity, the input/output waveguides, the gain region the output amplification region and the absorption regions based on the active vertical coupling structures;

specifically, in the step of transferring the defined patterns onto an III-V semiconductor to obtain the ring cavity, the input/output waveguides, the gain region the output amplification region and the absorption regions based on the active vertical coupling structures, the transferring manner may be dry etching, wet etching or the both; the etching depth is determined according to requirements of the ring cavity, the coupling waveguides, the gain region and the like; and the requirement of the etching roughness is determined according to a specific application.

Figure 4A:
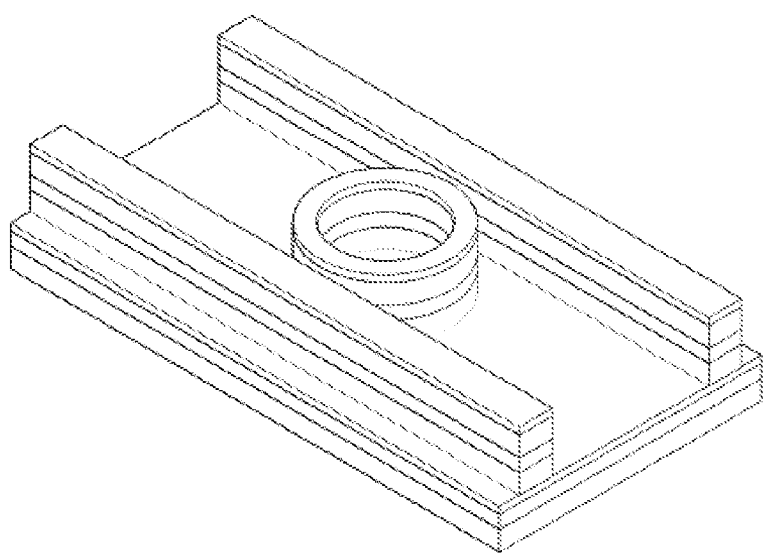
FIG. 4a is a schematic diagram of structures of input/output waveguides and a ring cavity after the first lithography is completed in embodiments of the present disclosure.

FIG. 4a shows a schematic diagram of structures of the input/output waveguides and the ring cavity after the first lithography is completed.

Figure 4B:
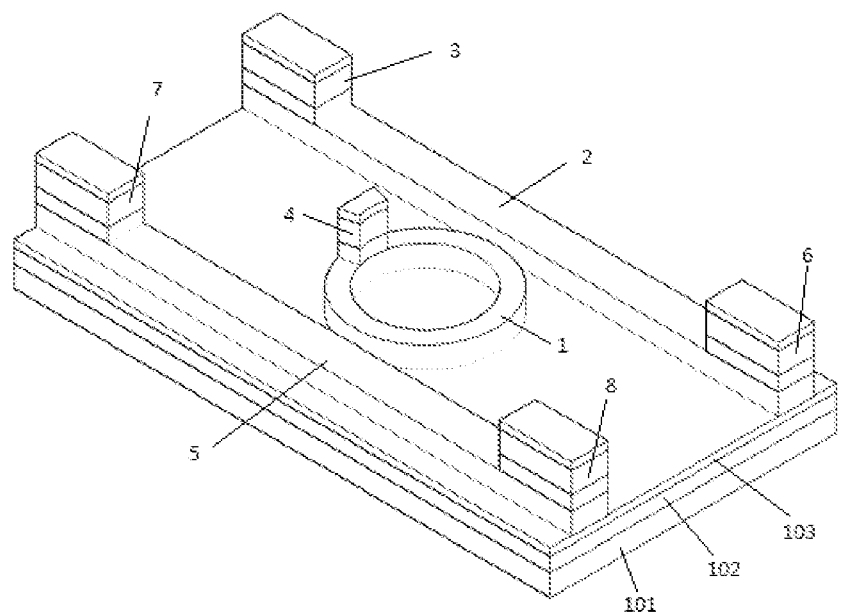
FIG. 4b is a schematic diagram of structures of the input/output waveguides, the ring cavity, a semiconductor optical amplifier and absorbers after the second lithography is completed in embodiments of the present disclosure.

(4) as shown in FIG. 4b, carrying out the second lithography on the formed waveguide structures so as to obtain the input/output waveguide regions and a passive ring cavity region;

(5) etching the contact layer, the surface cladding layer and the active gain layer in the above etched regions so as to form a corresponding passive waveguide region, the gain region and the absorption regions;

by utilizing the etching technique, the contact layer, the surface cladding layer and the active gain layer in the etched regions and a part of the middle space layer are removed so as to form the passive waveguide regions, wherein the etching manner may be dry etching, wet etching or the both; the etching depth should be determined according to the requirement of the passive mode and should ensure that the active gain layer and its above structures are completely removed.

(6) according to a conventional fabrication processing of semiconductor optoelectronic devices, passivating the waveguide regions, opening an electrode window and depositing a P-type electrode and a N-type electrode on the P side and the N side separately;

specifically, in the step of according to a conventional fabrication processing of semiconductor optoelectronic device, passivating the waveguide regions, opening an electrode window and depositing a P-type electrode and an N-type electrode on the P side and the N side separately, opening an electrode window and electrode deposition are required by the active vertical coupling structure, which is inserted in the ring resonator cavity and input-output ends of which are used for providing the gain; however, the active vertical coupling structure at the other end of the output does not require the operations of opening an electrode window and depositing a P-type electrode on the P side separately, the P-type electrode and the N-type electrode may be located on the same side of the substrate so as to form a co-planar electrode, and may also be located on the different sides of the substrate so as to form a double-side electrode.

(7) finally, carrying out cleaving and wire bonding, thereafter, a monolithically integrated narrow-linewidth semiconductor laser is finished, as shown in FIG. 3.

Figure 5A:
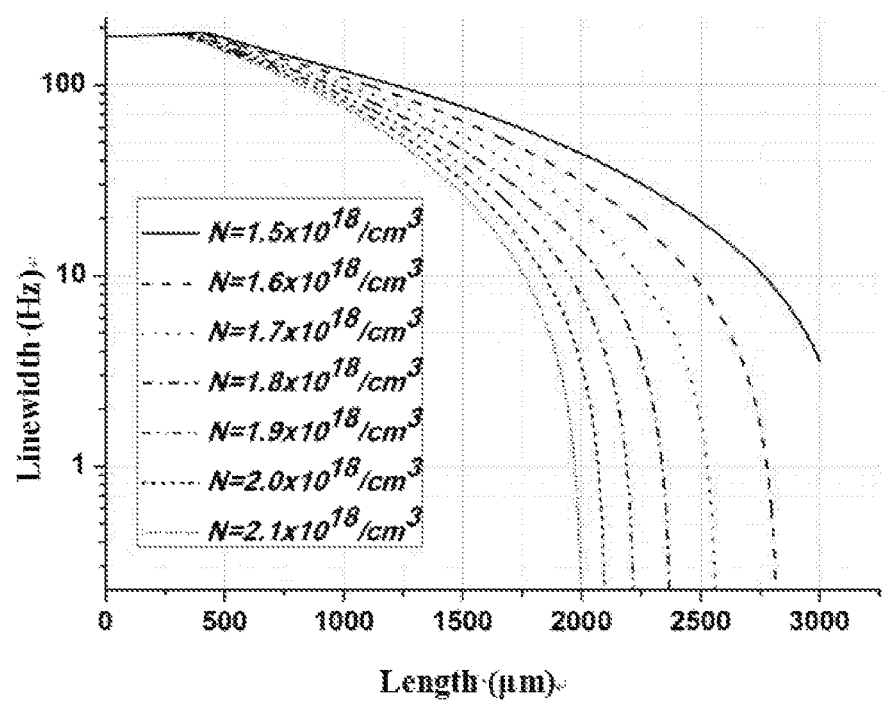
FIG. 5a shows the linewidth variation of a monolithically integrated narrow-linewidth semiconductor laser with the length of a first active waveguide in the ring cavity at the different concentration of injected carriers.
Figure 5B:
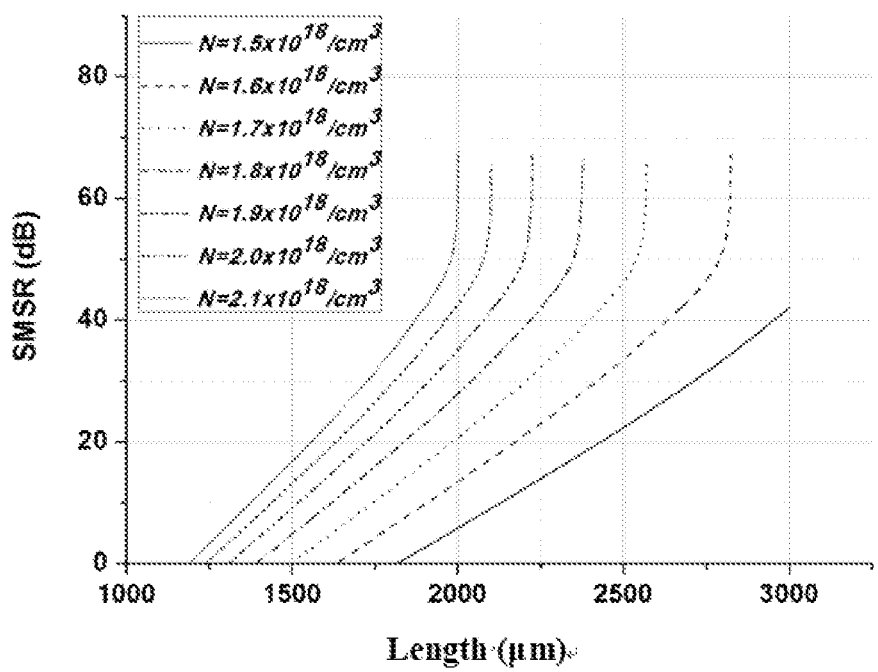
FIG. 5b shows the side-mode suppression ratio variation of the monolithically integrated narrow-linewidth semiconductor laser with the length of the first active waveguide in the ring cavity at the different concentration of the injected carriers.

FIG. 5a shows the linewidth variation of a monolithically integrated narrow-linewidth semiconductor laser with the length of a first active waveguide at the different concentration of injected carriers; and FIG. 5b shows the side-mode suppression ratio variation of the monolithically integrated narrow-linewidth semiconductor laser with the length of the first active waveguide at the different concentration of the injected carriers.

As shown in the FIG. 5a and FIG. 5b, along with the increase of the length of the first active waveguide and the increase of the concentration of carriers injected thereon, the linewidth of the monolithically integrated laser is gradually shortened, even reaches the order of sub-kHz, meanwhile, the side-mode suppression ratio is gradually increased, even reaches 60 dB, thereby completely meeting the existing coherent communication and detection application of the laser, so the laser is an ideal light source in the field.

Figure 6A:
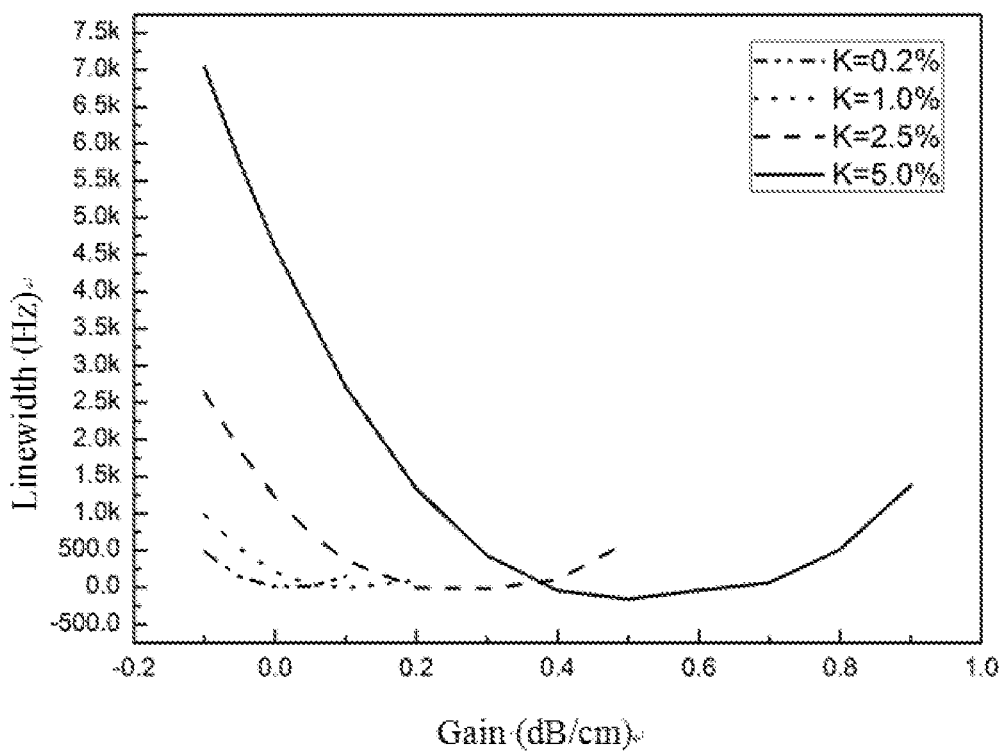
FIG. 6a and FIG. 6b respectively show the linewidth variation and the side-mode suppression ratio variation of a ring waveguide external-cavity semiconductor laser under different coupling coefficients with the cavity gain.
Figure 6B:
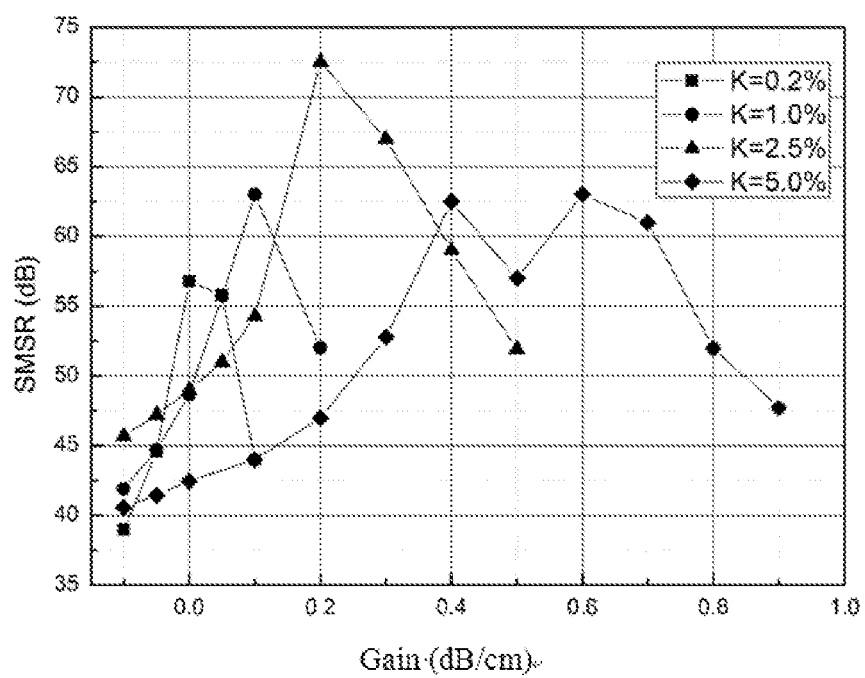

FIG. 6a and FIG. 6b respectively show variation rules of the linewidth and the side-mode suppression ratio of a loss-compensation type ring waveguide external cavity laser with the gain of the loss-compensated region, and it can be concluded that: based on the loss-compensated ring resonator external cavity the ring resonator under any coupling coefficients can work at the critical coupling state, where, the laser with ultra-narrow linewidth and ultra-high side-mode suppression ratio should be achieved.

According to the narrow-linewidth semiconductor layer provided by the present disclosure, the active coupling structure is applied to the ring resonator cavity to compensate the cavity loss, wherein such active coupling structure may not only provide the gain for the whole laser, but, if the structure is inserted in the ring resonator cavity, it can also compensate the cavity loss and make the ring resonator cavity extend the optical path, and make the laser shorten the linewidth.

Compared with DFB/DBR lasers, the laser provided by the present disclosure belongs to an external-cavity semiconductor laser and may obtain narrower linewidth and higher stability and reliability; and compared with other waveguide external-cavity semiconductor lasers, the laser provided by the present disclosure is of the monolithic integration structure or the on-chip integration structure, in one embodiment, especially based on the monolithic integration structure, the laser has the following advantages:

1, butt-coupling loss between the external cavity and the gain region may be completely eliminated, the threshold may be effectively reduced, and the linewidth may be shortened;

2, the same materials have consistent thermal property and mechanical property, so the device has good stability and reliability and high resistance to severe environment; and 3, due to uniform design and fabrication, good consistency of the components and low costs are achieved.

In conclusion, the narrow-linewidth laser provided by the present disclosure firstly utilizes the coupling structure of compensating the loss by the gain, so that the cavity loss is compensated, thereby effectively shortening the linewidth and achieving the narrow-linewidth semiconductor laser; by aiming to the characteristics of low output power and large back reflection noises of the weak-coupling ring resonator cavity laser, the semiconductor optical amplifier is integrated at the output end and is used for amplifying the lasing light, thereby enhancing the output power and further shortening the linewidth; additionally, the absorbers are integrated at the output back end and are used for absorbing the back reflection noises, thereby further improving the device performance; and due to there is no the butt-coupling loss between the gain region and the external cavity region for this integral formation semiconductor technique, the device has the advantages of low cost, higher stability and reliability, and high resistance to severe environment. Moreover, there is no linewidth limitation caused by the butt-coupling loss.

It should be noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also includes the elements inherent for the process, method, article or device. Unless expressively limited otherwise, the statement "comprising (including) one . . . " does not exclude the case that other similar elements may exist in the process, method, article or device.

The above is the preferred implementation mode of the disclosure. It should be noted that a plurality of improvements and modifications made by those ordinarily skilled in the art without departing from the principle of the disclosure shall fall within the protection scope of the disclosure.

What is claimed is:

1. A narrow-linewidth laser, characterized in that the laser comprises:
    a passive ring waveguide;
    a first passive input/output waveguide, coupled with the passive ring waveguide;
    a gain waveguide providing gain to the laser and vertically coupled to the first passive input/output waveguide;
    a gain wavelength-selection unit for selecting a light with a specific wavelength through vertical coupling of the gain waveguide to the first passive ring input/output waveguide; and
    a second passive input/output waveguide, coupled with the passive ring waveguide, on opposite side of the passive ring waveguide and parallel to the first passive input/output waveguide, in order to output lasing light from the laser,
    wherein the passive ring waveguide, the first passive input/output waveguide, and the second passive input/output waveguide are on a same layer,
    the gain waveguide is formed by a space layer, an active gain layer, a cladding layer, and a contact layer, the gain waveguide is physically connected to the first passive input/output waveguide, and
    the gain wavelength-selection unit selects a light through coupling to the first passive input/output waveguide.

2. The narrow-linewidth laser according to claim 1, characterized in that the gain waveguide provides gain for the laser, and the gain waveguide is vertically coupled with the first input/output waveguide in order to carry out wavelength selection, the gain waveguide covers partially the first input/output waveguide.

3. The narrow-linewidth laser according to claim 2, characterized in that the gain wavelength-selection unit further comprises a first grating matching with the first input/output waveguide to carry out wavelength selection and a single-mode laser is achieved by coupling between the gain waveguide and the first input/output waveguide and arrangement of the first grating.

4. The narrow-linewidth laser according to claim 2, characterized in that the gain waveguide is arranged at one end of the first input/output waveguide.

5. The narrow-linewidth laser according to claim 4, characterized in that a first absorber is integrated at the other end of the first input/output waveguide in order to eliminate stray lights and back reflection noises.

6. The narrow-linewidth laser according to claim 4, characterized in that the laser further comprises a second active waveguide, the second active waveguide coupled with the second input/output waveguide acts as an optical amplifier to amplify the lasing light from the gain waveguide, filtered through coupling with the first input/output waveguide, compensated cavity loss through coupling of the first active waveguide with the passive ring waveguide, and outputted by the second input/output waveguide, and based on this, the output power is enhanced and the linewidth of the laser is shortened.

7. The narrow-linewidth laser according to claim 6, characterized in that the second active waveguide is vertically coupled or laterally coupled with the second input/output waveguide.

8. The narrow-linewidth laser according to claim 7, characterized in that antireflection films are deposited on the facets of the second active waveguide and/or the second input/output waveguide and are used for reducing residual reflection light.

9. The narrow-linewidth laser according to claim 7, characterized in that the gain waveguide, the first active waveguide and the second active waveguide are monolithically integrated or on-chip integrated with the corresponding first input/output waveguide, the passive ring waveguide and the second input/output waveguide through a material growth or wafer bonding manner.

10. The narrow-linewidth laser according to claim 6, characterized in that the second active waveguide covers a part of the top surface of the second input/output waveguide vertically or is located adjacent to the second input/output waveguide laterally.

11. The narrow-linewidth laser according to claim 6, characterized in that the second active waveguide is arranged at one end of the second input/output waveguide.

12. The narrow-linewidth laser according to claim 11, characterized in that a second absorber is integrated at the other end of the second input/output waveguide in order to eliminate stray lights and back reflection noises.

13. The narrow-linewidth laser according to claim 6, characterized in that the gain waveguide, the first input/output waveguide, the passive ring waveguide, the first active waveguide, the second input/output waveguide and the second active waveguide are arranged on a substrate, and the materials of the gain waveguide, the first input/output waveguide, the passive ring waveguide, the first active waveguide, the second input/output waveguide and the second active waveguide are selected according to a material of the substrate, which may be semiconductors or dielectric materials.

14. The narrow-linewidth laser according to claim 2, characterized in that the laser comprises a first active waveguide integrated and coupled with the passive ring waveguide, and the first active waveguide is used for compensating the cavity loss of the passive ring waveguide resonator.

15. The narrow-linewidth laser according to claim 14, characterized in that the first active waveguide is vertically coupled or laterally coupled with the passive ring waveguide.

16. The narrow-linewidth laser according to claim 14, characterized in that the first active waveguide covers at least a part of the top surface of the passive ring waveguide vertically or is located adjacent to the passive ring waveguide laterally.

17. The narrow-linewidth laser according to claim 2, characterized in that high-reflective films are deposited on the facets of the gain waveguide and/or the first input/output waveguide and are used for reducing the mirror loss.

18. The narrow-linewidth laser according to claim 2, characterized in that the passive ring waveguide, the first input/output waveguide and the second input/output waveguide are fabricated from the same material and are formed on a substrate.

19. The narrow-linewidth laser according to claim 2, further comprising a first active waveguide, a first grating and a second grating, the second grating is defined in the part of the second passive input/output waveguide according to the requirement of the second active waveguide.

20. The narrow-linewidth laser according to claim 1, characterized in that the gain wavelength-selection unit further comprises a gain waveguide used for providing gain for the laser, the gain waveguide is laterally coupled with the first input/output waveguide to carry out wavelength selection, and the gain waveguide is located adjacent to the first input/output waveguide laterally.

* * * * *